United States Patent [19]

Kimura et al.

[11] Patent Number: 5,488,002
[45] Date of Patent: Jan. 30, 1996

[54] METHOD FOR MANUFACTURING SELF-ALIGNED BIPOLAR TRANSISTORS USING DOUBLE DIFFUSION

[75] Inventors: Koji Kimura, Chigasaki; Shin-ichi Taka, Kitakyushu, both of Japan

[73] Assignee: Kabushiki Kaisha Toshiba, Kawasaki, Japan

[21] Appl. No.: 302,199

[22] Filed: Sep. 8, 1994

[30] Foreign Application Priority Data

Sep. 10, 1993 [JP] Japan .................................. 5-226117

[51] Int. Cl.⁶ ............................................... H01L 21/265
[52] U.S. Cl. ............................. 437/31; 437/67; 437/141; 437/162; 437/954; 148/DIG. 10; 148/ DIG. 11; 148/DIG. 35; 257/526; 257/565; 257/586; 257/591
[58] Field of Search .......................... 437/31, 141, 162, 437/67, 954; 148/DIG. 10, 11, 35; 257/526, 586, 591, 565

[56] References Cited

U.S. PATENT DOCUMENTS

| | | |
|---|---|---|
| 4,960,726 | 10/1990 | Lechaton et al. ........................... 437/31 |
| 5,232,861 | 8/1993 | Miwa .......................... 437/31 |
| 5,279,976 | 1/1994 | Hayden et al. ........................... 437/31 |
| 5,302,535 | 4/1994 | Imai et al. ................................ 437/31 |
| 5,354,699 | 10/1994 | Ikeda et al. ............................. 437/162 |

FOREIGN PATENT DOCUMENTS 3-76575  9/1983  Japan .
5-41389  2/1993  Japan .

Primary Examiner—George Fourson
Assistant Examiner—Long Pham
Attorney, Agent, or Firm—Finnegan, Henderson, Farabow, Garrett & Dunner

[57] ABSTRACT

Manufacturing a double polysilicon layer self-aligned type bipolar transistor. A polysilicon layer for emitter impurity diffusion is formed prior to the formation of a polysilicon layer for leading out a base. A first polysilicon layer containing impurities for base impurity diffusion is deposited over the entire surface of a semiconductor structure. After the first polysilicon layer is patterned into a predetermined shape, an intrinsic base layer is formed by thermally diffusing impurities from a base impurity diffusion source. Subsequently, a second polysilicon layer containing emitter impurities is formed over the base impurity diffusion source, and then patterning is performed such that the first and second polysilicon layers remain in a region narrower than the base impurity diffusion source. Thereafter, an emitter layer is formed by thermal diffusion.

40 Claims, 8 Drawing Sheets

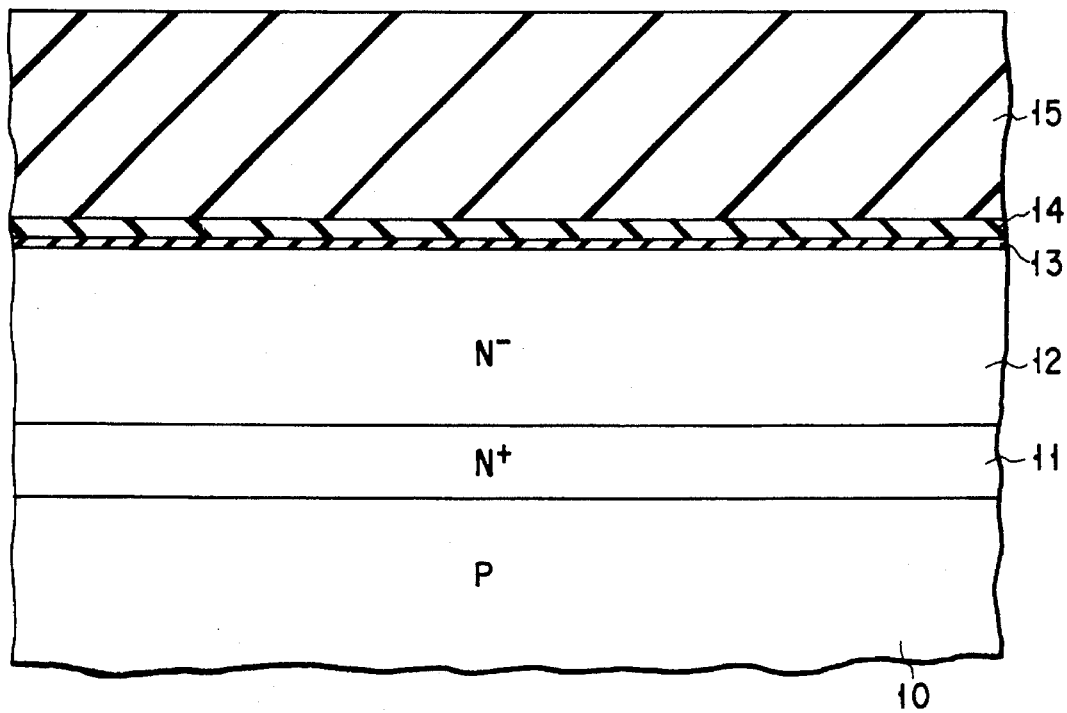
F I G. 2
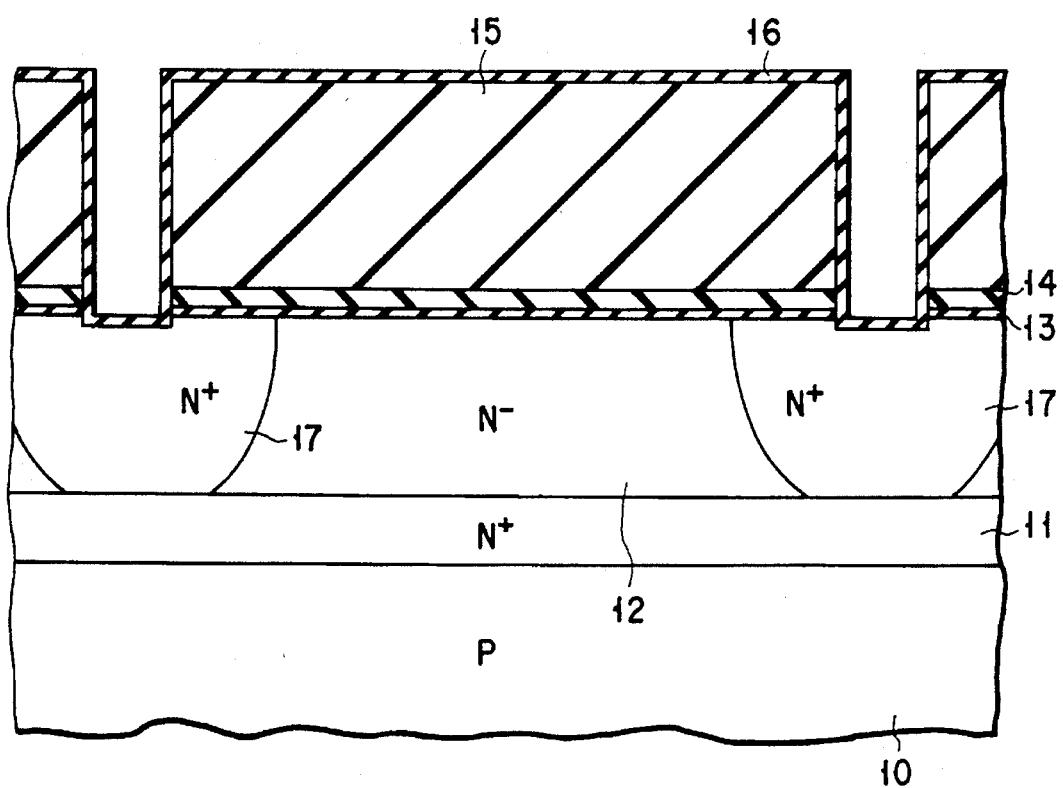
F I G. 3

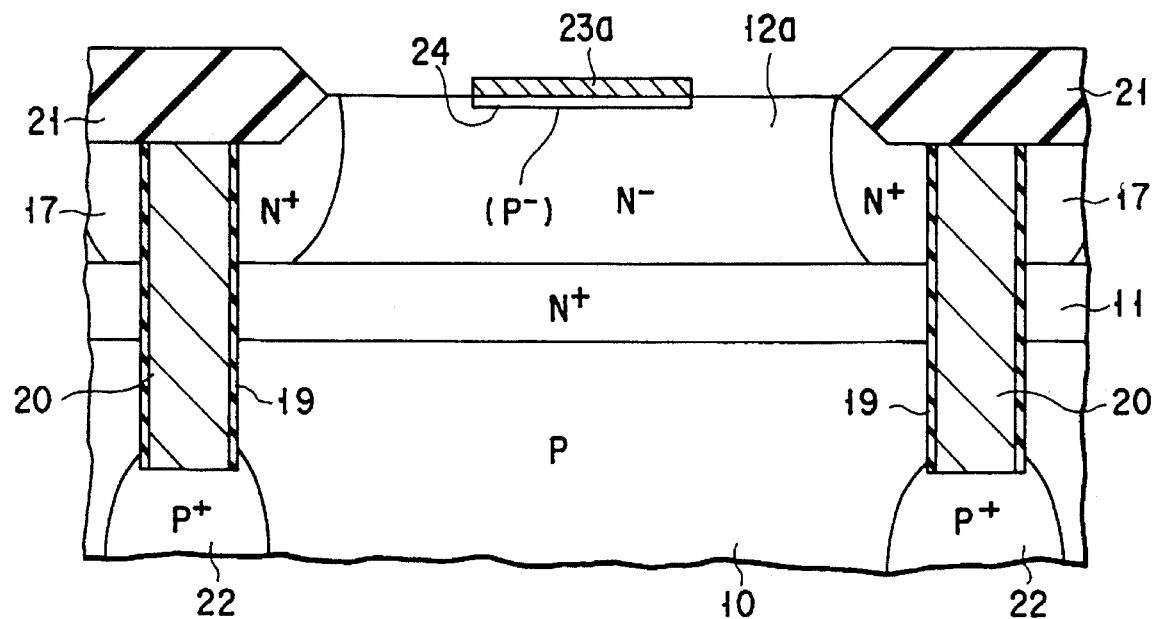
F I G. 8
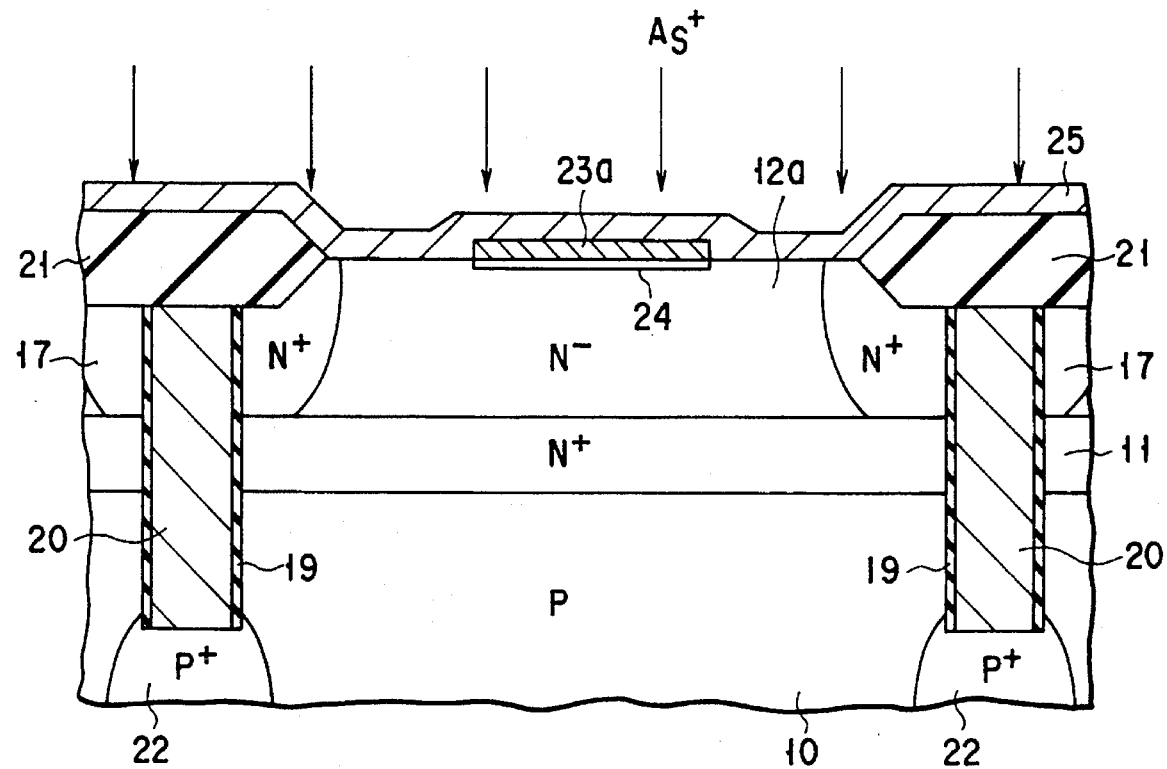
F I G. 9

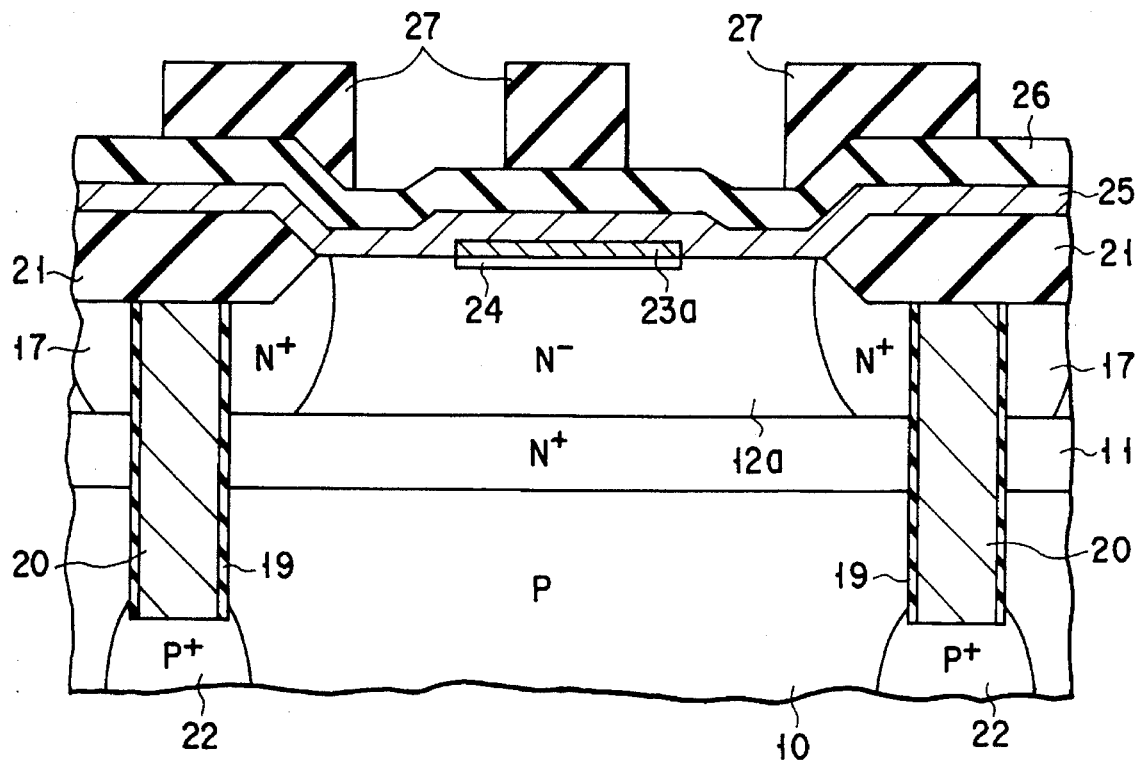
F I G. 10
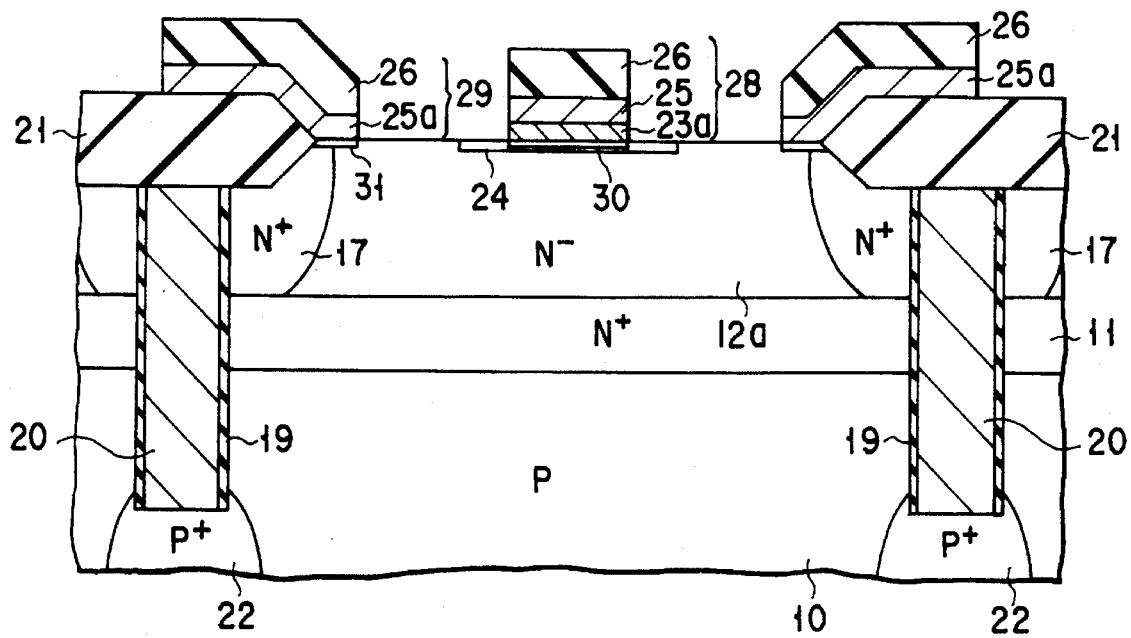
F I G. 11

METHOD FOR MANUFACTURING SELF-ALIGNED BIPOLAR TRANSISTORS USING DOUBLE DIFFUSION

BACKGROUND OF THE INVENTION

1. Field of the Invention

The present invention relates to a method for manufacturing bipolar transistors, and more particular to the method which is applied to the manufacture of a double polysilicon layer self-aligned type bipolar transistor wherein a polysilicon layer for emitter impurity diffusion is formed prior to the formation of a polysilicon layer for leading out a base, and which forms a base layer and an emitter layer by solid-phase diffusion of impurities from the polysilicon layer.

2. Description of the Related Art

In a bipolar transistor-manufacturing method which forms an emitter layer by diffusing impurities from a polysilicon layer, the base layer and the emitter layer are formed as follows. First of all, an intrinsic base layer is formed by ion implantation of boron (B). Then, a polysilicon layer doped with arsenic (As) is formed on the intrinsic base layer. Thereafter, the emitter layer is formed by the solid-phase diffusion of arsenic from the polysilicon layer into the intrinsic base layer.

In order to manufacture a high-speed bipolar transistor, it is desirable that the base layer and the emitter layer be as shallow as possible. However, the implantation of boron ions is not suitable for forming a sufficiently shallow base layer since the implanted boron ions are likely to adversely affect the channeling and since the diffusion coefficient of boron is comparatively high.

A method which is known in the art to solve this problem is to form an intrinsic base layer by solid-phase diffusion of impurities from a polysilicon layer initially intended for emitter impurity diffusion. This method is applied to the process of manufacturing a double polysilicon layer self-aligned type bipolar transistor, wherein a polysilicon layer for leading out a base is formed prior to the formation of a polysilicon layer for emitter impurity diffusion. For example, the method is applied to the manufacture of an SST (super self-aligned transistor) proposed by NTT Corporation or the manufacture of a semiconductor device shown in Jpn. Pat. Appln. KOKOKU Publication No. 3-76575 filed by IBM.

However, the method which forms a base layer and an emitter layer by double diffusion of p-type and n-type impurities by using the polysilicon layer for emitter impurity diffusion as an impurity diffusion source has problems in light of (1) the controllability of base and emitter impurity diffusion and (2) the formation of a link region between the intrinsic and extrinsic base layers. These problems will be detailed below.

In a double polysilicon layer self-aligned type bipolar transistor wherein a polysilicon layer for leading out a base is formed prior to a polysilicon layer for emitter impurity diffusion, the latter polysilicon layer is deposited in a hole region whose aspect ratio is very high. Therefore, the thickness of that portion of the polysilicon layer which is located immediately above the emitter layer cannot be reliably controlled. In addition, the boron diffusion from the polysilicon layer for emitter impurity diffusion cannot be reliably controlled, either.

Moreover, the particle diameters of the polysilicon layer for emitter impurity diffusion increase during the boron diffusion, and the diffusion coefficient of the arsenic contained in the polysilicon layer greatly decreases. As a result, the arsenic in the polysilicon layer has such a concentration profile as is shown in FIG. 1. Because of such an arsenic concentration profile, the arsenic diffusion (emitter impurity diffusion), which is executed after the boron diffusion, cannot be reliably controlled.

In the case where the base layer and the emitter layer are formed by the double diffusion mentioned above, a p-type link region for connecting the extrinsic base layer and the intrinsic base layer must be provided, and this link region must be formed independently of the formation of the intrinsic base layer. A known method for forming such a link region is to introduce boron (p-type impurities) by ion implantation before either the polysilicon layer for defining the emitter width or the side walls of an oxide film are formed.

The link region must be a diffusion layer which is sufficiently shallow in comparison with an intrinsic base layer to be formed later. However, in the case where the base layer and the emitter later are formed by double diffusion, the base junction is very shallow and is 0.15 µm or less, for example. It is therefore required that the junction depth of the link region be less than 0.10 µm.

In practice, however, such a shallow p-type diffusion layer is difficult to form by ion implantation, since the channeling is adversely affected by boron ions.

The link region mentioned above can be formed by the following two methods: (1) a method wherein $BF_2$ ions are first implanted both to suppress the adverse effects on the channeling and to decrease the effective implantation energy of boron, then n-type impurities (e.g., phosphorus) are introduced into the region which is slightly deeper than the link region (base region) by ion implantation, and then the n-type impurity concentration of the collector located directly under the link region is increased, so as to obtain a shallow junction; and (2) a method wherein, when an emitter opening is formed by etching an oxide film before the polysilicon layer for emitter impurity diffusion is deposited, the substrate surface is over-etched such that the surface of the intrinsic base layer is lower in level than the surface of the link region, whereby the link region is made shallower than the intrinsic base layer.

However, the former method (1) is faced with the following problems. When the base layer and the emitter layer are formed by double diffusion, the solid-phase diffusion from the polysilicon layer is utilized for forming both of them. Although the active region does not have any irradiation defect due to ion implantation, the $BF_2$ ion implantation executed for the formation of the link region inevitably produces a large number of irradiation defects, and the number of radiation damage thus produced is very large in comparison with the number of irradiation defects produced when boron ions are implanted into the base layer in an ordinary method for manufacturing bipolar transistors. On the other hand, the latter method (2) is faced with the following problems. When the substrate surface is over-etched, the etching accuracy cannot be easily controlled. In addition, since the side faces of the substrate which are formed by the over-etching serve as an emitter surface, the effective emitter width is inevitably different from the intended emitter width.

In an effort to solve these problems, the inventors of the present invention proposed how double diffusion should be performed and how a link region should be formed when such a transistor as the SST mentioned above was manufactured. The proposal is disclosed in Japanese Patent Application No. 3-343198 entitled "METHOD FOR MANUFACTURING HIGH-SPEED BIPOLAR TRANSISTOR".

However, in a double polysilicon layer self-aligned type bipolar transistor wherein a polysilicon layer for leading out a base is formed prior to the formation of a polysilicon layer for emitter impurity diffusion, the latter polysilicon layer is deposited in a hole region whose aspect ratio is very high, as mentioned above. Since boron (base impurity) is diffused from this polysilicon layer, the diffusion of the base impurity cannot be controlled reliably. Hence, the proposal made in the Japanese Patent Application No. 3-343198 has its limit.

It may be thought to manufacture the double polysilicon layer self-aligned type bipolar transistor by forming the two polysilicon layers in the opposite order, i.e., the polysilicon layer for emitter impurity diffusion is formed first, and then the polysilicon layer for leading out a base is formed. In such a bipolar transistor, the polysilicon layer for emitter impurity diffusion can be deposited to be as flat as possible, and the boron diffusion (base impurity diffusion) from this flat polysilicon layer can be controlled very reliably.

However, in the conventional double polysilicon layer self-aligned type bipolar transistor wherein a polysilicon layer for emitter impurity diffusion is formed prior to the formation of a polysilicon layer for leading out a base, an emitter layer is formed by diffusion such that it is self-aligned with the pattern of none other than the polysilicon layer for emitter impurity diffusion. Therefore, the double diffusion process mentioned above cannot be applied to the manufacture of the conventional bipolar transistor.

In order to apply the double diffusion process to the manufacture of the conventional NPN-type transistor, the desirable impurity concentrations in the base and emitter layers and the relationships between the diffusion coefficients of boron and arsenic have to be taken into consideration. It is therefore required that boron be first diffused from the polysilicon layer for emitter impurity diffusion (which contains the boron as base impurities), then arsenic (i.e., emitter impurities) be introduced into that polysilicon layer, and then the arsenic be diffused from the polysilicon layer, for the formation of an emitter layer.

However, the arsenic necessary for emitter impurity diffusion cannot be reliably introduced into the polysilicon layer after this polysilicon layer, which contains boron, is patterned.

As described above, according to the conventional art, a double polysilicon layer self-aligned type bipolar transistor wherein a polysilicon layer for emitter impurity diffusion is formed prior to the formation of a polysilicon layer for leading out a base, cannot be manufactured by utilization of the double diffusion process. To be specific, a base layer and an emitter layer cannot be sequentially formed by double diffusion of p- and n-type impurities from the polysilicon layer initially intended for emitter impurity diffusion.

SUMMARY OF THE INVENTION

Accordingly, an object of the present invention is provide a bipolar transistor-manufacturing method which is applied to the process of manufacturing a double polysilicon layer self-aligned type bipolar transistor wherein a polysilicon layer for emitter impurity diffusion is formed prior to the formation of a polysilicon layer for leading out a base, which enables the impurities used for sequentially forming a base layer and an emitter layer to be diffused from a polysilicon layer in the solid-phase manner, and which forms the base layer and the emitter layer by double diffusion from that polysilicon layer.

According to the present invention, there is provided a bipolar transistor-manufacturing method comprising: a first step of depositing a first polycrystalline semiconductor film containing second impurities of a second conductivity type over a semiconductor substrate containing first impurities of a first conductivity type; a second step of partially removing the first polycrystalline semiconductor film such that a desirable portion thereof remains; a third step of forming a first semiconductor layer of the second conductivity type by diffusing the second impurities from the remaining portion of the first polysilicon semiconductor film into the semiconductor substrate; a fourth step of depositing a second polycrystalline semiconductor film containing third impurities of the first conductivity type over the resultant structure; a fifth step of depositing a first insulation film over the resultant structure; a sixth step of partially removing the first insulation film, the second polycrystalline semiconductor film and the first polycrystalline semiconductor film such that a laminated film made up of desirable portions of the first insulation film, second polycrystalline semiconductor film and first polycrystalline semiconductor film remains in a region narrower than a region where the desirable portion of the first polycrystalline semiconductor film remains; a seventh step of forming a second semiconductor layer of the first conductivity type by diffusing the third impurities from the second polycrystalline semiconductor film into the first semiconductor layer through the first polycrystalline semiconductor film; an eighth step of forming a second insulation film on a side wall of the laminated film made up of the desirable portions of the first insulation film, second polycrystalline semiconductor film and first polycrystalline semiconductor film; a ninth step of depositing a third polycrystalline semiconductor film containing the second impurities of the second conductivity type over the resultant structure; and a tenth step of forming a third semiconductor layer of the second conductivity type by diffusing the second impurities from the third polycrystalline semiconductor film into the semiconductor substrate, the third semiconductor layer being electrically connected to the first semiconductor layer.

According to the present invention, there is also provided a bipolar transistor-manufacturing method comprising: a first step of depositing a first polycrystalline semiconductor film containing second impurities of a second conductivity type over a semiconductor substrate containing first impurities of a first conductivity type; a second step of partially removing the first polycrystalline semiconductor film such that a desirable portion thereof remains; a third step of forming a first semiconductor layer of the second conductivity type by diffusing the second impurities from the remaining portion of the first polysilicon semiconductor film into the semiconductor substrate; a fourth step of depositing a second polycrystalline semiconductor film containing third impurities of the first conductivity type over the resultant structure; a fifth step of depositing a first insulation film over the resultant structure; a sixth step of partially removing the first insulation film, the second polycrystalline semiconductor film and the first polycrystalline semiconductor film such that a laminated film made up of desirable portions of the first insulation film, second polycrystalline semiconductor film and first polycrystalline semiconductor film remains in a region narrower than a region where the desirable portion of the first polycrystalline semiconductor film remains; a seventh step of forming a second insulation film on a side wall of the laminated film made up of the desirable portions of the first insulation film, second polycrystalline semiconductor film and first polycrystalline semiconductor film; an eighth step of depositing a third polycrystalline semiconductor film containing the second impurities of the second conductivity type over the resultant structure; and a ninth step of forming a second semiconductor layer of the first conductivity type by diffusing the third impurities from the second polycrystalline semiconductor film into the first semiconductor layer through the first polycrystalline semiconductor film, and further forming a third semiconductor layer of the second conductivity type by diffusing the second impurities from the third polycrystalline semiconductor film into the semiconductor substrate, the third semiconductor layer being electrically connected to the first semiconductor layer.

According to the present invention, there is further provided a bipolar transistor-manufacturing method comprising: a first step of forming a buried layer of a first conductivity type on a semiconductor substrate; a second step of forming a collector layer of the first conductivity type on the buried layer; a third step of forming a collector-leading layer of the first conductivity type in the collector layer, the collector-leading layer being deep enough to be adjacent to the buried layer; a fourth step of depositing a first polycrystalline semiconductor film containing first impurities of a second conductivity type over the resultant structure; a fifth step of partially removing the first polycrystalline semiconductor film such that a desirable portion thereof remains; a sixth step of forming an intrinsic base layer of the second conductivity type by diffusing the second impurities from the remaining portion of the first polysilicon semiconductor film into the collector layer; a seventh step of depositing a second polycrystalline semiconductor film containing second impurities of the first conductivity type over the resultant structure; an eighth step of depositing a first insulation film over the resultant structure; a ninth step of partially removing the first insulation film, the second polycrystalline semiconductor film and the first polycrystalline semiconductor film such that a first laminated film made up of desirable portions of the first insulation film, second polycrystalline semiconductor film and first polycrystalline semiconductor film remains in a region narrower than a region where the desirable portion of the first polycrystalline semiconductor film remains and such that a second laminated film made up of desirable portions of the first insulation film and second polycrystalline semiconductor film remains in the neighborhood of the collector-leading layer; a tenth step of forming an emitter layer of the first conductivity type by diffusing second impurities from the second polycrystalline semiconductor film of the first laminated film, which remains in the region narrower than the region where the desirable portion of the first polycrystalline semiconductor film remains, into the intrinsic base layer through the first polycrystalline semiconductor film, and further forming a diffusion layer, which connects the second polycrystalline semiconductor film to the collector-leading layer, by diffusing the second impurities from the second polycrystalline semiconductor film of the second laminated film, which remains in the neighborhood of the collector-leading layer, into both the collector-leading layer and the collector layer adjacent thereto; an eleventh step of forming a spacer on a side wall of the first laminated film made up of the desirable portions of the first insulation film, second polycrystalline semiconductor film and first polycrystalline semiconductor film and on a side wall of the second laminated film made up of the desirable portions of the first insulation film and second polycrystalline semiconductor film; a twelfth step of depositing a third polycrystalline semiconductor film containing the third impurities of the second conductivity type over the resultant structure; and a thirteenth step of forming an extrinsic base layer by diffusing the third impurities from the third polycrystalline semiconductor film into the collector layer, the extrinsic base layer being electrically connected to the intrinsic base layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional view illustrating one of the steps involved in the first embodiment of the bipolar transistor-manufacturing method of the present invention;

FIG. 3 is a sectional view illustrating the step subsequent to the step depicted in FIG. 2;

FIG. 8 is a sectional view illustrating the step subsequent to the step depicted in FIG. 7;

FIG. 9 is a sectional view illustrating the step subsequent to the step depicted in FIG. 8;

FIG. 10 is a sectional view illustrating the step subsequent to the step depicted in FIG. 9;

FIG. 11 is a sectional view illustrating the step subsequent to the step depicted in FIG. 10;

DETAILED DESCRIPTION OF THE PREFERRED EMBODIMENTS

Figure 1:
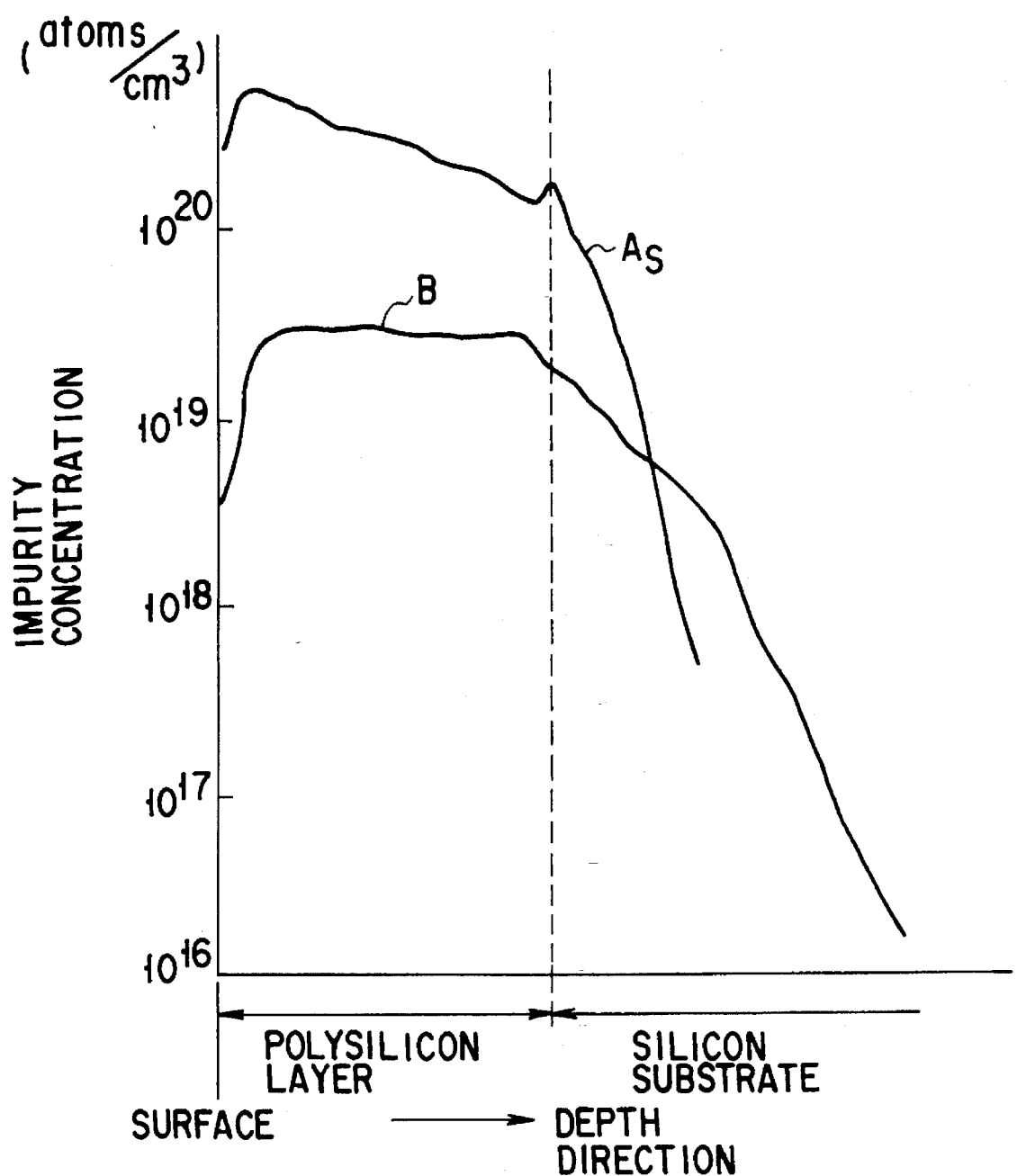
FIG. 1 is a graph showing the concentration profiles of the impurities (boron and arsenic) contained in the polycrystalline silicon layer and the silicon substrate of a bipolar transistor manufactured in the conventional method.

Embodiments of the present invention will now be described with reference to the accompanying drawings.

According to the first embodiment of the present invention, a bipolar transistor is manufactured by sequentially following the steps illustrated in the sectional views in FIGS.

2–12. Referring first to FIG. 2, an N⁺-type buried layer 11 is formed on a P-type silicon substrate 10, and an N⁻-type single crystalline semiconductor layer 12 having a thickness of 1.0 μm is formed on the buried layer 11 by epitaxial growth. Subsequently, a first oxide film 13 having a thickness of 30 nm is formed by oxidizing the surface of the semiconductor layer 12, and a first nitride film 14 is deposited over the first oxide film 13 by a CVD process (a chemical vapor deposition process) until the thickness of the first nitride film 14 becomes 100 nm. Thereafter, a second oxide film 15 is deposited over the first nitride film 14 by the CVD process until the thickness of the second oxide film 15 becomes 1.0 μm.

Referring next to FIG. 3, a resin pattern (not shown) used for forming a trench isolation is formed on the second oxide film 15. With the resist pattern as a mask, an opening is formed in the region corresponding to a prospective element separation region by sequentially etching the second oxide film 15, the first nitride film 14 and the first oxide film 13 by anisotropic etching, e.g., by RIE (reactive ion etching). Next, a PSG (phosphor silicate glass) film 16 having a phosphor concentration of 4% is deposited by the CVD process over the entire surface of the resultant structure, including the inner surfaces of the opening formed in the second oxide film 15, the first nitride film 14 and the first oxide film 13. The deposition of the PSG film 16 is continued until its thickness becomes 30 nm. Thereafter, an N⁺ diffusion layer 17 (i.e., a collector electrode) is formed in the semiconductor layer 12 by thermal diffusion.

Figure 4:
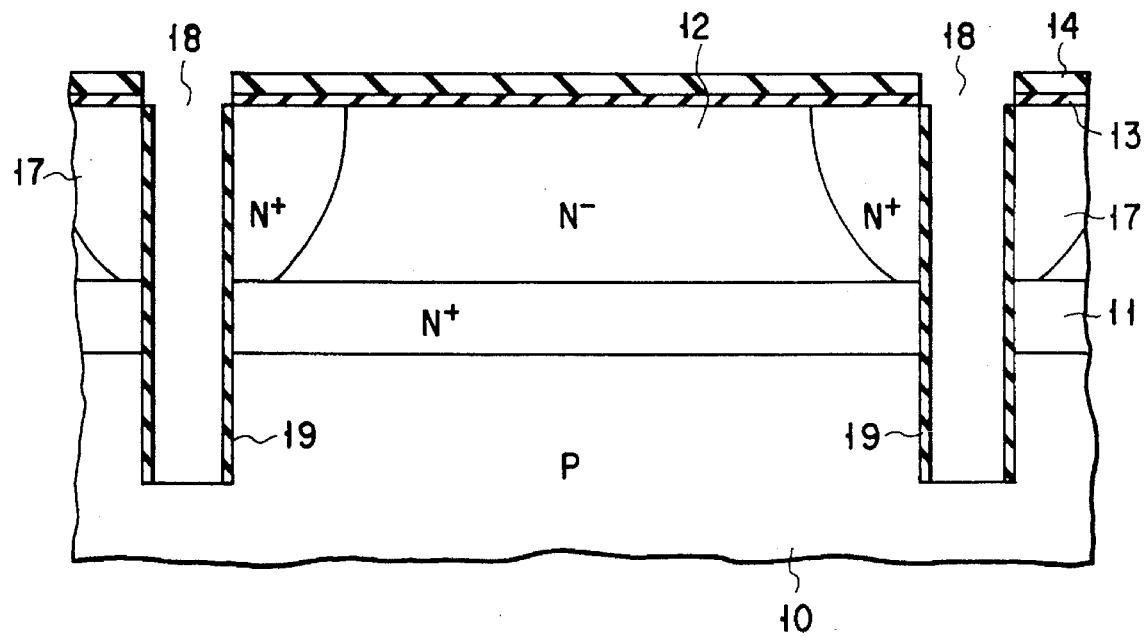
FIG. 4 is a sectional view illustrating the step subsequent to the step depicted in FIG. 3.

As shown in FIG. 4, a trench 18, the bottom of which reaches the silicon substrate 10, is formed by anisotropically etching the semiconductor structure (e.g., the RIE of the semiconductor structure) by 6.0 μm or so, with the second oxide film 15 as a mask. Subsequently, a third oxide film 19 having a thickness of 50 nm is formed on the side walls of the trench 18 by thermal oxidation.

Figure 5:
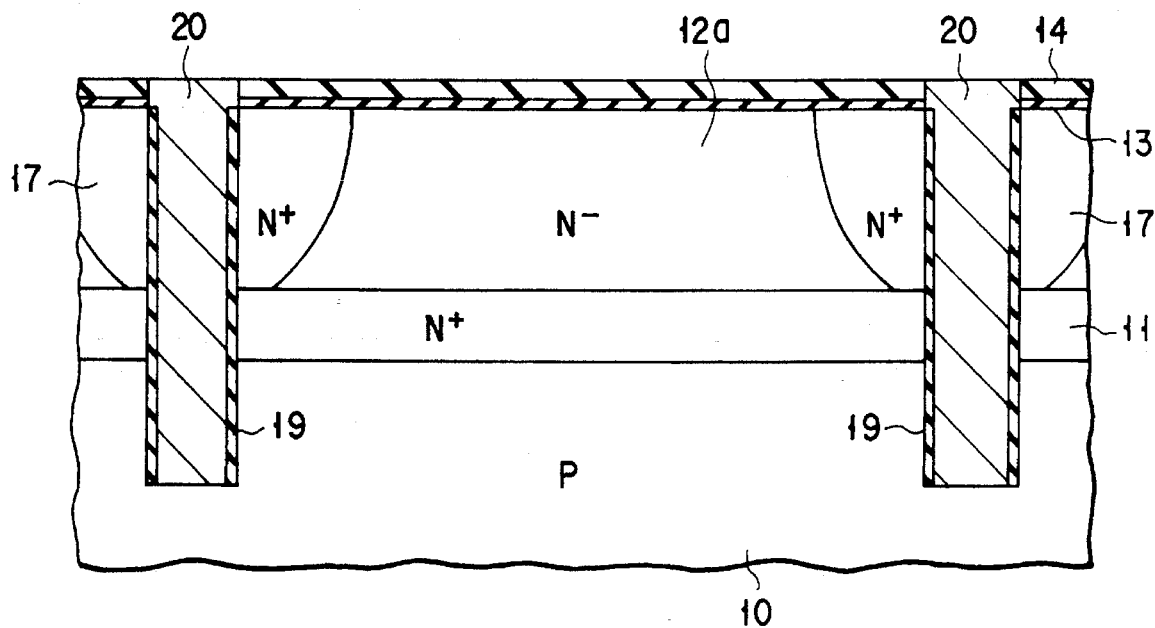
FIG. 5 is a sectional view illustrating the step subsequent to the step depicted in FIG. 4.

As shown in FIG. 5, a first polysilicon layer 20 containing boron as impurities is deposited over the entire surface of the resultant structure until the thickness of the first polysilicon layer 20 becomes 2.0 μm. By this deposition, the trench 18 is filled with the first polysilicon layer 20. Thereafter, the resultant structure is polished, with the first nitride film 14 as a stopper. In this manner, trench isolation is executed for element separation, with the first polysilicon layer 20 remaining inside the trench 18. As a result of the trench isolation, the N⁻-type semiconductor layer 12 is separated from the other structural elements and serves as a collector layer 12a of one bipolar transistor.

Figure 6:
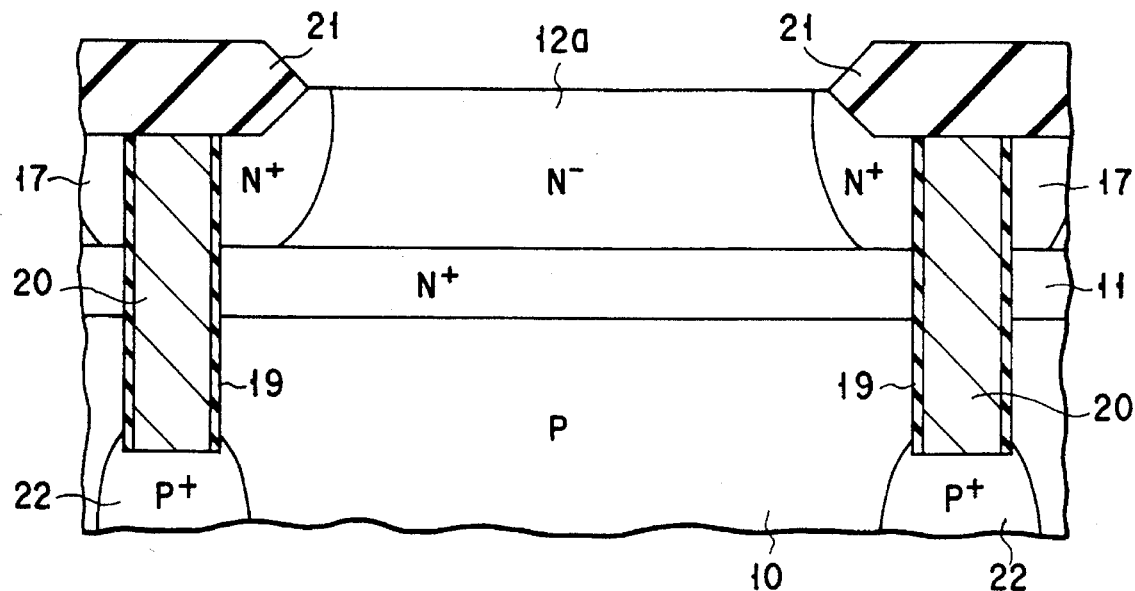
FIG. 6 is a sectional view illustrating the step subsequent to the step depicted in FIG. 5.

Referring to FIG. 6, the first nitride film 14 is patterned such that it remains only in the region located above the element region. By executing a LOCOS process (selective oxidation) by use of the pattern of the first nitride film 14, a third oxide film 21 having a thickness of 700 nm is formed above the trench. At the time, the boron contained in the first polysilicon layer 20 is diffused into the silicon substrate 10, thus forming a P⁺-type diffusion region 22. Thereafter, the first nitride film 14 is removed, and the first oxide film 13 located above the element region is removed.

Figure 7:
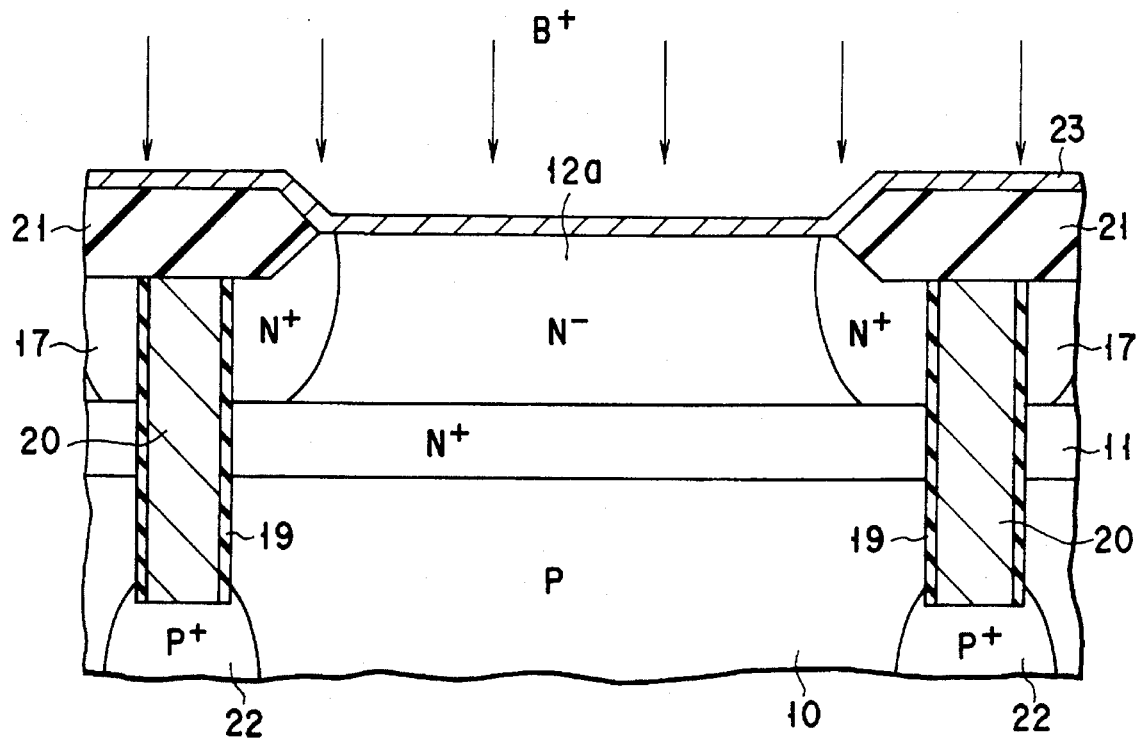
FIG. 7 is a sectional view illustrating the step subsequent to the step depicted in FIG. 6.

As shown in FIG. 7, a second polysilicon layer 23 (i.e., a polysilicon layer for emitter impurity diffusion) is deposited over the entire surface of the resultant structure by the CVD process until the thickness of the second polysilicon layer 23 becomes 150 nm. Then, boron ions (B⁺) are doped into the second polysilicon layer 23 in an amount of $1 \times 10^{14}$ to $1 \times 10^{15}$ ions/cm² in accordance with the predetermined impurity concentration in the base.

Then, the second polysilicon layer 23 is made to remain only in a region wider than a prospective emitter region, as shown in FIG. 8. In other words, the second polysilicon layer 23 is etched by anisotropic etching (e.g., RIE) such that the portions of layer 23 which are wider than a prospective collector-leading electrode are removed. As a result, a base impurity diffusion source 23a is formed. Further, an oxide film (not shown) for preventing the out diffusion is deposited by the CVD process, and the resultant semiconductor structure is annealed for about 10 to 30 minutes at a temperature of 900° to 950° C., thereby diffusing boron from the base impurity diffusion source 23a into the collector layer 12a. As a result, a P⁻-type intrinsic base layer 24 is formed.

Referring to FIG. 9, the oxide film for preventing the out diffusion is removed, and a third polysilicon layer 25 is deposited over the entire surface of the resultant structure by the CVD process until the thickness of the third polysilicon layer 25 becomes 100 nm. Then, arsenic ions (As⁺) are doped into the third polysilicon layer 25 in an amount of about $1 \times 10^{16}$ ions/cm² in accordance with the desirable impurity concentration in the emitter.

Then, as shown in FIG. 10, a fourth oxide film 26 having a thickness of 400 nm is deposited over the entire surface of the resultant semiconductor structure by the CVD process, and a resist pattern 27 of a predetermined shape is formed on the fourth oxide film 26. RIE is executed, with the resist pattern 27 as a mask, such that a laminated film 28 made up of the fourth oxide film 26, the third polysilicon layer 25 and the base impurity diffusion source 23a (the second polysilicon layer 23) remains in the region above the prospective emitter region (i.e., in the region narrower than the base impurity diffusion source 23a) and such that a laminated film 29 made up of the fourth oxide film 26 and the third polysilicon layer 25a remains in the region which is located above the element separation region and part of the element formation region. After this treatment, the third polysilicon layer 25 and base impurity diffusion source 23a of laminated film 28 are used as an emitter electrode, and the third polysilicon layer 25a of laminated film 29 is used as a collector-leadout electrode.

After the resist pattern 27 is removed, an oxide film (not shown) used for preventing the out diffusion is deposited by the CVD process, and the resultant structure is annealed for about 10 to 30 minutes at a temperature of 900° to 1,000° C. As a result, the arsenic contained in the third polysilicon layer 25 of laminated film 28 is diffused into the intrinsic base layer 24 through the second polysilicon layer 23, thereby forming an emitter layer 30. Simultaneously, the arsenic contained in the third polysilicon layer 25a of laminated film 29 is diffused into the N⁺ diffusion layer 17 (i.e., the collector electrode) and the region located in the vicinity thereof. Since an N⁺ diffusion layer 31 is formed thereby, the collector-leadout electrode 25a is electrically connected to the N⁺ diffusion layer (collector electrode) 17.

Figure 12:
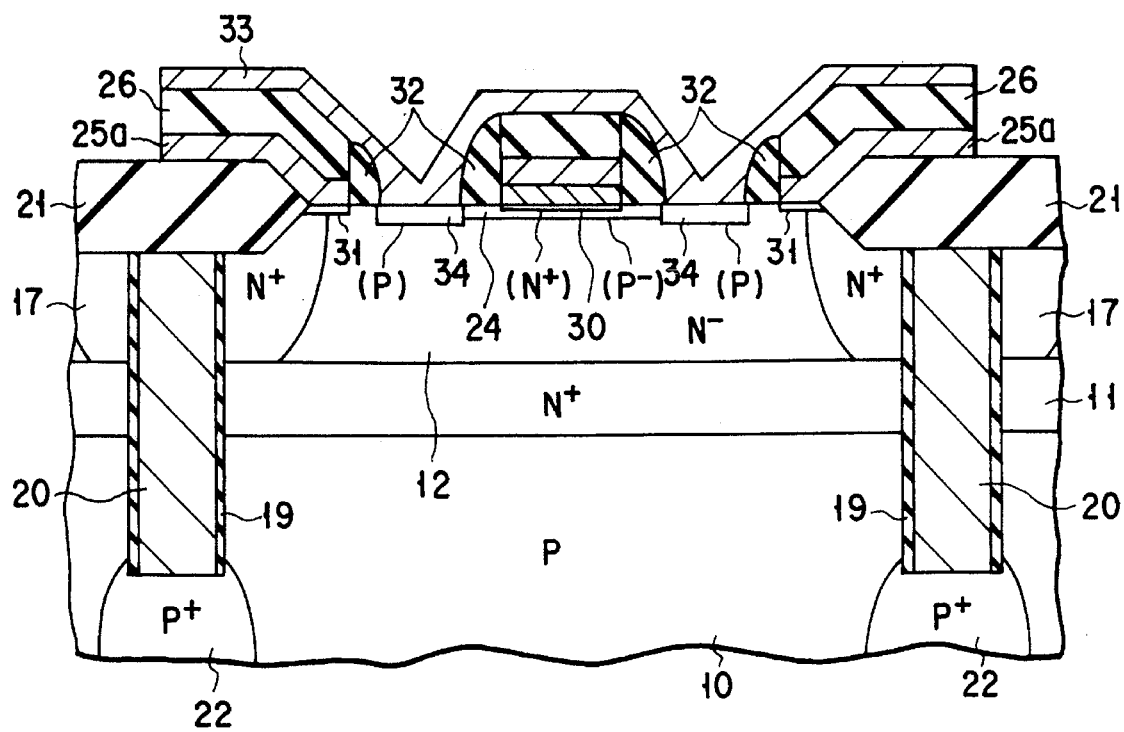
FIG. 12 is a sectional view illustrating the step subsequent to the step depicted in FIG. 11.

Then, as shown in FIG. 12, a fifth oxide film having a thickness of 400 nm is formed over the entire surface of the resultant structure by the CVD process. The fifth oxide film is etched back by RIE, thereby forming a spacer 32 (made of the fifth oxide film) on the side walls of each of the laminated films 28 and 29.

Further, a fourth polysilicon layer 33 (i.e., a polysilicon layer for leading out the base) having a thickness of 150 nm is deposited over the entire surface of the resultant structure by the CVD process, and boron is doped into the fourth polysilicon layer 33 by performing ion implantation in an amount of about $5 \times 10^{15}$ ions/cm².

After an oxide film (not shown) used for preventing the out diffusion is deposited by the CVD process, the resultant structure is annealed for about 10 to 30 minutes at a temperature of 900° to 1,000° C. As a result of this annealing, the boron contained in the fourth polysilicon layer 33 is diffused into the collector layer 12a, and an extrinsic base layer 34 is formed thereby.

Finally, wires are connected to the base, the emitter and the collector by use of an ordinary wiring technique, thus completing the manufacture of a bipolar transistor.

According to the method of the above embodiment, a double polysilicon layer self-aligned type bipolar transistor wherein a polysilicon layer for emitter impurity diffusion is formed prior to the formation of a polysilicon layer for leading out a base, is manufactured in the following steps: a step of patterning a first polysilicon layer 23 containing base impurities and then thermally executing solid-phase diffusion from the first polysilicon layer 23 to form an intrinsic base layer 24; a step of forming a second polysilicon layer 25 containing emitter impurities on the first polysilicon layer 23 and then executing patterning such that the second polysilicon layer 25 and the first polysilicon layer 23 remain in a region narrower than a base impurity diffusion source 23a (i.e., the patterned first polysilicon layer 23), and a step of thermally executing solid-phase diffusion from the second polysilicon layer 25 to form an emitter layer 24.

Since the double polysilicon layer self-aligned type transistor is manufactured by following the above steps, the impurity diffusion at the time of forming the base layer and the emitter layer can be controlled more reliably than the conventional method, wherein the double diffusion is applied to the manufacture of a double polysilicon layer self-aligned type bipolar transistor wherein a polysilicon layer for leading out a base is formed prior to the formation of a polysilicon layer for emitter impurity diffusion.

Figure 13:
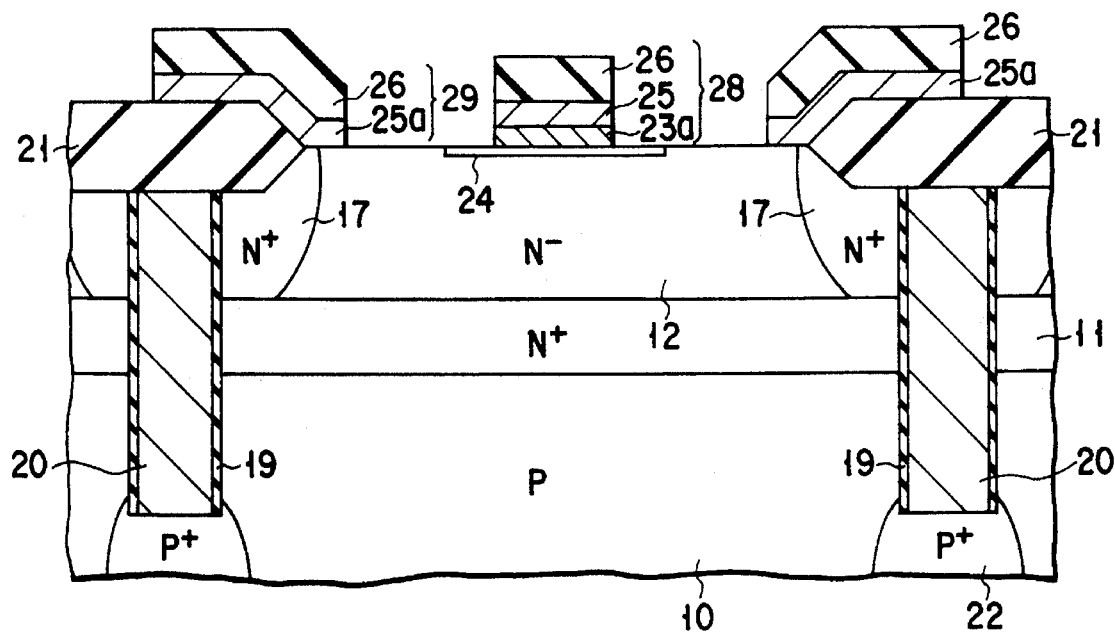
FIG. 13 is a sectional view illustrating one of the steps involved in the second embodiment of the bipolar transistor-manufacturing method of the present invention.
Figure 14:
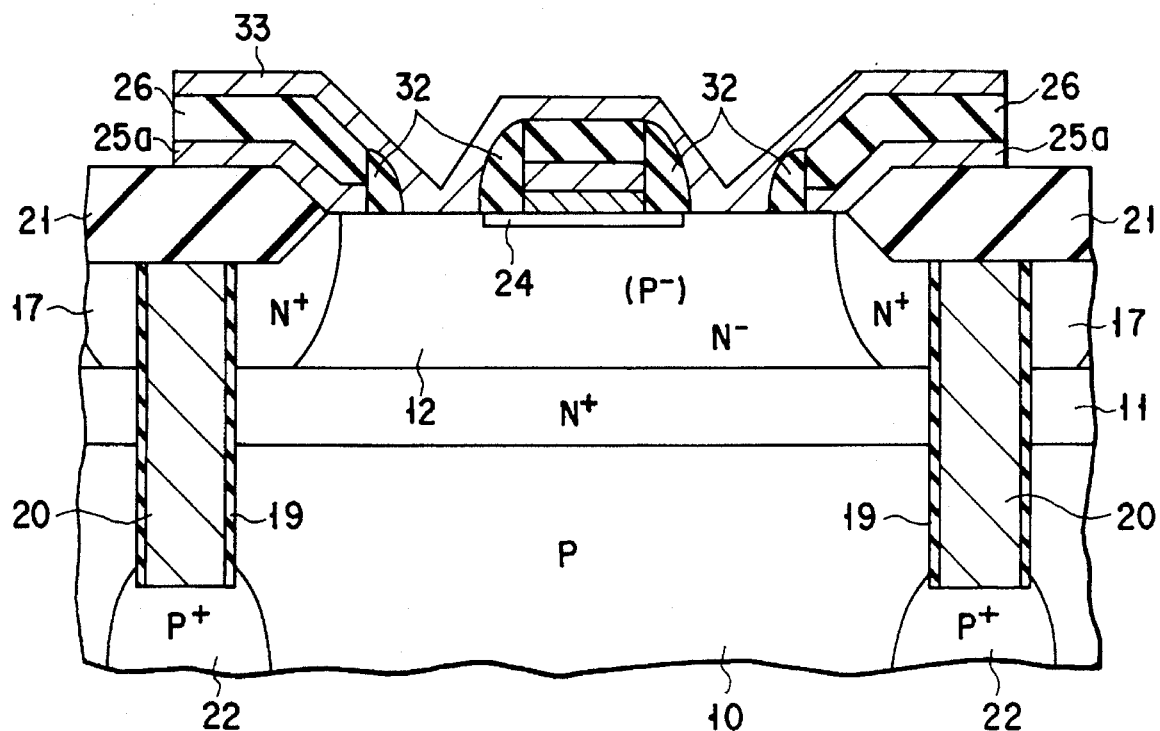
FIG. 14 is a sectional view illustrating the step subsequent to the step depicted in FIG. 13.

In the method of the first embodiment, the extrinsic base layer 34 is formed by impurity diffusion after the emitter layer 30 and the $N^+$-type diffusion layer 31 are formed. However, the emitter layer 30, the $N^+$-type layer 31 and the extrinsic base layer 34 may be simultaneously formed. FIGS. 13 and 14 are sectional views illustrating the bipolar transistor-manufacturing method according to the second embodiment, wherein an emitter layer, an $N^+$-type layer and an extrinsic base layer 34 are simultaneously formed by impurity diffusion.

According to the method illustrated in FIGS. 13 and 14, RIE is executed with the resist pattern 27 as a mask, after execution of the step illustrated in FIG. 10. Subsequent to the RIE, the resist pattern 27 is removed in the manner shown in FIG. 13. Without executing impurity diffusion immediately after the removal of the resist pattern 27, a spacer 32 is formed in the manner shown in FIG. 14. Thereafter, a polysilicon layer 33 used for leading out a base is deposited, and boron is doped into the polysilicon layer 33 by ion implantation in a similar manner to that described above. After an oxide film (not shown) used for preventing the out diffusion is deposited, the resultant structure is annealed. As a result of this annealing, an extrinsic base layer 34 is formed by the boron diffusion from the polysilicon layer used for leading out the base, an emitter layer 30 is formed by the arsenic diffusion from the second polysilicon layer 25 of laminated film 28 into the intrinsic base layer 24 through the first polysilicon layer 23, and an $N^+$-type diffusion layer 31 is formed by the arsenic diffusion from the second polysilicon layer 25a of laminated film 29 (refer to FIG. 12). The method of the second embodiment differs from that of the first embodiment in that the emitter layer 30, the $N^+$-type diffusion layer 31 and the extrinsic base 34 are formed by impurity diffusion by executing annealing only once.

As described above, the bipolar transistor-manufacturing method of the present invention, which is applied to the process of manufacturing a double polysilicon layer self-aligned type bipolar transistor wherein a polysilicon layer for emitter impurity diffusion is formed prior to the formation of a polysilicon layer for leading out a base, enables the impurities used for sequentially forming a base layer and an emitter layer to be diffused from a polysilicon layer in the solid-phase manner and which forms the base layer and the emitter layer by double diffusion. Accordingly, the method of the present invention enables the base layer and the emitter layer to be as shallow as possible.

In addition, in comparison with the conventional method wherein the double diffusion is applied to the manufacture of a double polysilicon layer self-aligned type bipolar transistor wherein a polysilicon layer for leading out a base is formed prior to the formation of a polysilicon layer for emitter impurity diffusion, the impurity diffusion at the time of forming diffusion layers can be controlled very reliably.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing bipolar transistors, comprising:

a first step of depositing a first polycrystalline semiconductor film containing second impurities of a second conductivity type over a semiconductor substrate containing first impurities of a first conductivity type;

a second step of selectively removing the first polycrystalline semiconductor film such that the first polycrystalline semiconductor film remains in a region where a first semiconductor layer is formed;

a third step of forming a first semiconductor layer of the second conductivity type by diffusing the second impurities from the remaining portion of the first polysilicon semiconductor film into the semiconductor substrate;

a fourth step of depositing a second polycrystalline semiconductor film containing third impurities of the first conductivity type over a resultant structure;

a fifth step of depositing a first insulation film over a resultant structure;

a sixth step of selectively removing a laminated film made up of the first insulating film, the second polycrystalline semiconductor film and the first polycrystalline semiconductor film, such that the laminated film remains in a region where a second semiconductor layer is formed;

a seventh step of forming a second semiconductor layer of the first conductivity type by diffusing the third impurities from the second polycrystalline semiconductor film into the first semiconductor layer through the first polycrystalline semiconductor film;

an eight step of forming a second insulation film on a side wall of the laminated film made up of the first insulation film, second polycrystalline semiconductor film and first polycrystalline semiconductor film;

a ninth step of depositing a third polycrystalline semiconductor film containing the second impurities of the second conductivity type over a resultant structure; and a tenth step of forming a third semiconductor layer of the second conductivity type by diffusing the second impurities from the third polycrystalline semiconductor film into the semiconductor substrate, said third semiconductor layer being electrically connected to the first semiconductor layer.

2. A method according to claim 1, wherein said first step includes:

a first substep of depositing a first polycrystalline semiconductor film containing no impurities over the semiconductor substrate; and a second substep of introducing second impurities of the second conductivity type into the first polycrystalline semiconductor film.

3. A method according to claim 2, wherein said second substep is executed by ion implantation of boron ions.

4. A method according to claim 1, wherein said second step is executed by performing anisotropic etching, using a resist mask having a predetermined pattern.

5. A method according to claim 1, wherein said third step is executed by performing solid-phase diffusion of the second impurities contained in the first polycrystalline semiconductor film.

6. A method according to claim 1, wherein said fourth step includes:

a first substep of depositing a second polycrystalline semiconductor film containing no impurities; and a second substep of introducing third impurities of the first conductivity type into the second polycrystalline semiconductor film.

7. A method according to claim 6, wherein said second substep is executed by ion implantation of arsenic ions.

8. A method according to claim 1, wherein said sixth step is executed by anisotropic etching, using a resist mask having a predetermined pattern.

9. A method according to claim 1, wherein said seventh step is executed by performing annealing at a selected temperature within a range of 900° to 1,000° C. for a selected time within a range of 10 to 30 minutes.

10. A method according to claim 1 wherein said eighth step includes:

a first substep of depositing a second insulation film; and a second substep of etching back the second insulation film by anisotropic etching.

11. A method according to claim 1, wherein said ninth step includes:

a first substep of depositing a third polycrystalline semiconductor film containing no impurities; and a second substep of introducing second impurities of the second conductivity type into the third polycrystalline semiconductor film.

12. A method according to claim 11, wherein said second substep is executed by ion implantation of boron ions.

13. A method according to claim 1, wherein said seventh step and said tenth step are executed by performing annealing at an equal temperature for an equal time.

14. A method according to claim 1, wherein said tenth step is executed by performing annealing at a selected temperature within a range of 900° to 1,000° C. for a selected time within a range of 10 to 30 minutes.

15. A method for manufacturing bipolar transistors, comprising:

a first step of depositing a first polycrystalline semiconductor film containing second impurities of a second conductivity type over a semiconductor substrate containing first impurities of a first conductivity type;

a second step of selectively removing the first polycrystalline semiconductor film such that the first polycrystalline semiconductor film remains in a region where a first semiconductor layer is formed;

a third step of forming a first semiconductor layer of the second conductivity type by diffusing the second impurities from the remaining portion of the first polysilicon semiconductor film into the semiconductor substrate;

a fourth step of depositing a second polycrystalline semiconductor film containing third impurities of the first conductivity type over a resultant structure;

a fifth step of depositing a first insulation film over a resultant structure;

a sixth step of selectively removing a laminated film made up of the first insulation film, the second polycrystalline semiconductor film and the first polycrystalline semiconductor film, such that the laminated film defines a region where a second insulation film is formed;

a seventh step of forming a second insulation film on a side wall of the laminated film made up of the first insulation film, second polycrystalline semiconductor film and first polycrystalline semiconductor film;

an eighth step of depositing a third polycrystalline semiconductor film containing the second impurities of the second conductivity type over a resultant structure; and a ninth step of forming a second semiconductor layer of the first conductivity type by diffusing the third impurities from the second polycrystalline semiconductor film into the first semiconductor layer through the first polycrystalline semiconductor film, and further forming a third semiconductor layer of the second conductivity type by diffusing the second impurities from the third polycrystalline semiconductor film into the semiconductor substrate, said third semiconductor layer being electrically connected to the first semiconductor layer.

16. A method according to claim 15, wherein said first step includes:

a first substep of depositing a first polycrystalline semiconductor film containing no impurities over the semiconductor substrate; and a second substep of introducing second impurities of the second conductivity type into the first polycrystalline semiconductor film.

17. A method according to claim 16, wherein said second substep is executed by ion implantation of boron ions.

18. A method according to claim 15, wherein said second step is executed by performing anisotropic etching, using a resist mask having a predetermined pattern.

19. A method according to claim 15, wherein said third step is executed by performing solid-phase diffusion of the second impurities contained in the first polycrystalline semiconductor film.

20. A method according to claim 15, wherein said fourth step includes:

a first substep of depositing a second polycrystalline semiconductor film containing no impurities; and a second substep of introducing third impurities of the first conductivity type into the second polycrystalline semiconductor film.

21. A method according to claim 20, wherein said second substep is executed by ion implantation of arsenic ions.

22. A method according to claim 15, wherein said sixth step is executed by anisotropic etching, using a resist mask having a predetermined pattern.

23. A method according to claim 15, wherein said seventh step includes:

a first substep of depositing a second insulation film; and a second substep of etching back the second insulation film by anisotropic etching.

24. A method according to claim 15, wherein said eighth step includes:

a first substep of depositing a third polycrystalline semiconductor film containing no impurities; and a second substep of introducing second impurities of the second conductivity type into the third polycrystalline semiconductor film.

25. A method according to claim 24, wherein said second substep is executed by ion implantation of boron ions.

26. A method according to claim 15, wherein said ninth step is executed by performing annealing at a selected temperature within a range of 900° to 1,000° C. for a selected time within a range of 10 to 30 minutes.

27. A method for manufacturing bipolar transistors, comprising:

a first step of forming a buried layer of a first conductivity type on a semiconductor substrate;

a second step of forming a collector layer of the first conductivity type on the buried layer;

a third step of forming a collector-leading layer of the first conductivity type in the collector layer, said collector-leading layer being deep enough to be adjacent to the buried layer;

a fourth step of depositing a first polycrystalline semiconductor film containing first impurities of a second conductivity type over a resultant structure;

a fifth step of selectively removing the first polycrystalline semiconductor film such that the first polycrystalline semiconductor film remains in a region where an intrinsic base layer is formed;

a sixth step of forming an intrinsic base layer of the second conductivity type by diffusing the second impurities from the remaining portion of the first polysilicon semiconductor film into the collector layer;

a seventh step of depositing a second polycrystalline semiconductor film containing second impurities of the first conductivity type over a resultant structure;

an eighth step of depositing a first insulation film over a resultant structure;

a ninth step of selectively removing a laminated film made up of the first insulation film, the second polycrystalline semiconductor film and the first polycrystalline semiconductor film, such that a first portion of the laminated film remains in a region narrower than the intrinsic base layer and such that a second portion of the laminated film remains in a region corresponding to the collector-leading layer;

a tenth step of forming an emitter layer of the first conductivity type by diffusing second impurities from the second polycrystalline semiconductor film of the remaining first portion of the laminated film into the intrinsic base layer through the first polycrystalline semiconductor film, and further forming a diffusion layer, which connects the second polycrystalline semiconductor film to the collector-leading layer, by diffusing the second impurities from the second polycrystalline semiconductor film of the remaining second portion of the laminated film into both the collector-leading layer and the collector layer adjacent thereto;

an eleventh step of forming a spacer on a side wall of the remaining first portion of the laminated film and on a side wall of the remaining second portion of the laminated film;

a twelfth step of depositing a third polycrystalline semiconductor film containing the third impurities of the second conductivity type over a resultant structure; and a thirteenth step of forming an extrinsic base layer by diffusing the third impurities from the third polycrystalline semiconductor film into the collector layer, said extrinsic base layer being electrically connected to the intrinsic base layer.

28. A method according to claim 27, wherein said fourth step includes:

a first substep of depositing a first polycrystalline semiconductor film containing no impurities over the collector layer; and a second substep of introducing first impurities of the second conductivity type into the first polycrystalline semiconductor film.

29. A method according to claim 28, wherein said second substep is executed by ion implantation of boron ions.

30. A method according to claim 27, wherein said fifth step is executed by performing anisotropic etching, using a resist mask having a predetermined pattern.

31. A method according to claim 27, wherein said sixth step is executed by performing solid-phase diffusion of the first impurities contained in the first polycrystalline semiconductor film.

32. A method according to claim 27, wherein said seventh step includes:

a first substep of depositing a second polycrystalline semiconductor film containing no impurities; and a second substep of introducing second impurities of the first conductivity type into the second polycrystalline semiconductor film.

33. A method according to claim 32, wherein said second substep is executed by ion implantation of arsenic ions.

34. A method according to claim 27, wherein said ninth step is executed by anisotropic etching, using a resist mask having a predetermined pattern.

35. A method according to claim 27, wherein said tenth step is executed by performing annealing at a selected temperature within a range of 900° to 1,000° C. for a selected time within a range of 10 to 30 minutes.

36. A method according to claim 27, wherein said eleventh step includes:

a first substep of depositing a second insulation film; and a second substep of etching back the second insulation film by anisotropic etching such that the second insulation film remains on a side wall of the first laminated film and on a side wall of the second laminated film.

37. A method according to claim 27, wherein said twelfth step includes:

a first substep of depositing a third polycrystalline semiconductor film containing no impurities; and a second substep of introducing third impurities of the second conductivity type into the third polycrystalline semiconductor film.

38. A method according to claim 37, wherein said second substep is executed by ion implantation of boron ions.

39. A method according to claim 27, wherein said tenth step and said thirteen step are executed by performing annealing at an equal temperature for an equal time.

40. A method according to claim 27, wherein said tenth step and said thirteen step are executed by performing annealing at a selected temperature within a range of 900° to 1,000° C. for a selected time within a range of 10 to 30 minutes.

* * * * *